United States Patent [19]
Kudou

[11] Patent Number: 5,867,062
[45] Date of Patent: Feb. 2, 1999

[54] DC-OFFSET CANCELER CIRCUIT AND DIFFERENTIAL AMPLIFIER CIRCUIT EQUIPPED THEREWITH

[75] Inventor: Hiroshi Kudou, Tokyo, Japan

[73] Assignee: NEC Corporation, Tokyo, Japan

[21] Appl. No.: 974,986

[22] Filed: Nov. 20, 1997

[30] Foreign Application Priority Data

Nov. 20, 1996 [JP] Japan ..................... 8-308556

[51] Int. Cl.⁶ ........................................ H03F 3/68
[52] U.S. Cl. ................... 330/124 R; 330/124 D
[58] Field of Search .................... 323/312, 315; 330/257, 288, 124 R, 124 D; 327/307

[56] References Cited

U.S. PATENT DOCUMENTS

| | | | |
|---|---|---|---|
| 4,933,642 | 6/1990 | Lee | 330/9 |
| 5,506,537 | 4/1996 | Kimura | 327/351 |
| 5,557,239 | 9/1996 | Masao | 330/259 |

FOREIGN PATENT DOCUMENTS

| | | |
|---|---|---|
| 0 397 250 A2 | 11/1990 | European Pat. Off. . |
| 58-111415 | 7/1983 | Japan . |
| 61-52012 | 3/1986 | Japan . |
| 1-255306 | 10/1989 | Japan . |
| 1-268303 | 10/1989 | Japan . |
| 2-246604 | 10/1990 | Japan . |
| 3-227137 | 10/1991 | Japan . |
| 4-40108 | 2/1992 | Japan . |
| 4-84509 | 3/1992 | Japan . |
| 4-240905 | 8/1992 | Japan . |

*Primary Examiner*—Matthew V. Nguyen
*Attorney, Agent, or Firm*—Scully, Scott, Murphy and Presser

[57] ABSTRACT

A dc-offset canceler circuit is provided, which cancels a dc offset more effectively. This circuit includes a first differential pair of emitter-coupled first and second bipolar transistors driven by a first constant current source/sink, and a second differential pair of emitter-coupled third and fourth bipolar transistors driven by a second constant current source/sink. The first and second differential pairs are coupled by a coupling capacitor. An emitter of a fifth bipolar transistor is connected to the emitters of the first and second transistors. An emitter of a sixth bipolar transistor is connected to the emitters of the third and fourth transistors. Bases of the first and fifth transistors are connected to a first input terminal. A base of the second transistor is connected to the first input terminal through a first resistor. Bases of the fourth and sixth transistors are connected to a second input terminal. A base of the third transistor is connected to the second input terminal through a second resistor. Collectors of the first, third, and sixth transistors are connected to a first output terminal, and those of the second, fourth, and fifth transistors are connected to a second output terminal.

5 Claims, 4 Drawing Sheets

DC-OFFSET CANCELER CIRCUIT AND DIFFERENTIAL AMPLIFIER CIRCUIT EQUIPPED THEREWITH

BACKGROUND OF THE INVENTION

1. Field of the Invention

The present invention relates to a dc-offset canceler circuit and a differential amplifier circuit and more particularly, to a dc-offset canceler circuit which is preferably used for an amplifier circuit amplifying a signal in a low-frequency region such as 1 kHz to 10 kHz (e.g., the baseband frequency region) in a portable telecommunication system such as a pager system, and a differential amplifier circuit equipped with the dc-offset canceler circuit.

2. Description of the Prior Art

In recent years, a direct conversion receiver has been popularly used as a portable radio receiver such as a pager instead of a conventional superheterodyne receiver.

A limiting amplifier circuit designed for a direct conversion receiver of a pager amplifies a signal in the baseband frequency region (typically, 1 kHz to 10 kHz). This limiting amplifier circuit has a configuration that a plurality of differential amplifier subcircuits are cascade-connected at a plurality of stages, in which the differential amplifier subcircuits located at two adjoining ones of the stages are directly coupled without coupling capacitors. This is due to the following reason.

The coupling capacitor needs to have a large capacitance for the signal in the baseband frequency region and as a result, this capacitor occupies a large area on an Integrated Circuit (IC) chip. Accordingly, the coupling configuration with the coupling capacitor having such the large capacitance is not suitable to ICs. On the other hand, the directly coupling configuration requires no coupling capacitor and therefore, no problem relating to the chip area will occur.

With the limiting amplifier circuit having the direct-coupling configuration, the "dc offset" generated in the differential amplifier subcircuits at the respective stages tends to cause some known problems. To solve the problems, various techniques have been studied and developed for a long time, an example of which is shown in FIG. 1.

FIG. 1 shows a conventional dc blocking amplifier circuit having a dc-offset canceling function, which is disclosed in the Japanese Non-Examined Patent Publication No. 2-305205 published in 1990.

As shown in FIG. 1, the conventional dc blocking amplifier circuit S300 includes a first differential amplifier subcircuit S100 and a second differential amplifier subcircuit S200, which are coupled together by an ac-coupling capacitor 113.

The first differential amplifier subcircuit S100 is comprised of an emitter-coupled pair of npn-type bipolar transistors 101 and 102. The coupled emitters of the transistors 101 and 102 are connected to one end of a constant current sink 111 sinking a constant current $I_{101}$. The other end of the constant current sink 111 is connected to the ground.

A resistor 109 is connected to the bases of the transistors 101 and 102. The base of the transistor 101 is further connected to a first input terminal 114. The base of the transistor 102 is further connected to one end of the coupling capacitor 113.

The second differential amplifier subcircuit S200 is comprised of an emitter-coupled pair of npn-type bipolar transistors 103 and 104. The coupled emitters of the transistors 103 and 104 are connected to one end of a constant current sink 112 sinking a constant current $I_{102}$. The other end of the constant current sink 112 is connected to the ground.

A resistor 110 is connected to the bases of the transistors 103 and 104. The base of the transistor 103 is further connected to the other end of the coupling capacitor 113. The base of the transistor 104 is further connected to a second input terminal 115.

First and second input voltages are differentially applied across the first and second input terminals 114 and 115, respectively.

Collectors of the transistors 101 and 103 are coupled together to be connected to an end of a load resistor 107. The other end of the load resistor 107 is applied with a power supply voltage $V_{CC}$. The coupled collectors of the transistors 101 and 103 are further connected to a first output terminal 116.

Collectors of the transistors 102 and 104 are coupled together to be connected to one end of another load resistor 108. The other end of the load resistor 108 is applied with the power supply voltage $V_{CC}$. The coupled collectors of the transistors 102 and 104 are further connected to a second output terminal 117.

First and second output voltages are differentially derived from the first and second output terminals 116 and 117, respectively.

The transistors 101, 102, 103, and 104 have a same emitter area.

Next, the operation of the conventional dc blocking amplifier circuit S300 in FIG. 1 is explained below.

First, base voltages of the transistors 101, 102, 103, and 104 with respect to a specific reference point (e.g. the ground) are defined as $V_{B101}$, $V_{B102}$, $V_{B103}$, and $V_{B104}$, respectively. Collector currents of the transistors 101, 102, 103, and 104 are defined as $I_{C101}$, $I_{C102}$, $I_{C103}$, and $I_{C104}$, respectively. First and second output currents flowing through the load resistor 107 and 108 are defined as $I_{C113}$ and $I_{C124}$, respectively.

Then, the following equations (1) and (2) are established.

$$I_{C113} = I_{C101} + I_{C103} \tag{1}$$

$$I_{C124} = I_{C102} + I_{C104} \tag{2}$$

The collector currents $I_{C101}$, $I_{C102}$, $I_{C103}$, and $I_{C104}$ of the transistors 101, 102, 103, and 104 are expressed as the following equations (3), (4), (5), and (6), respectively.

$$I_{C101} = \frac{\alpha \cdot I_{101}}{1 + \exp\left\{q \dfrac{V_{B101} - V_{B102}}{kT}\right\}} \tag{3}$$

$$I_{C102} = \frac{\alpha \cdot I_{101}}{1 + \exp\left\{-q \dfrac{V_{B101} - V_{B102}}{kT}\right\}} \tag{4}$$

$$I_{C103} = \frac{\alpha \cdot I_{102}}{1 + \exp\left\{q \dfrac{V_{B104} - V_{B103}}{kT}\right\}} \tag{5}$$

$$I_{C104} = \frac{\alpha \cdot I_{102}}{1 + \exp\left\{-q \dfrac{V_{B104} - V_{B103}}{kT}\right\}} \tag{6}$$

In the equations (3), (4), (5), and (6), $\alpha$ is the dc common-base current gain factor of each transistor, k is the Boltzmann's constant, T is absolute temperature in degrees Kelvin, and q is the charge of an electron. Typically, the gain factor a is approximately equal to 1.

When the constant current $I_{102}$ of the constant current sink 112 is equal to the constant current $I_{101}$ of the constant current sink 111 (i.e., $I_{101}=I_{102}$), and the difference between the base voltages $V_{B104}$ and $V_{B103}$ of the transistors 104 and 103 are equal to the difference between the base voltages $V_{B101}$ and $V_{B102}$ of the transistors 101 and 102 (i.e., $V_{B101}-V_{B102}=V_{B104}-V_{B103}$), the first and second output currents $I_{C113}$ and $IC_{124}$ become equal to each other. If the load resistors 107 and 108 have a same resistance, the first and second output voltages will have a same dc level at the first and second output terminals 116 and 117.

If the dc voltage level of the first input voltage at the first input terminal 114 is higher than that of the second input voltage at the second input terminal 115 due to a dc offset, the base voltages $V_{B101}$, $V_{B102}$, $V_{B104}$, and $V_{B103}$ satisfy the relationships of $V_{B101} > V_{B102}$ and $V_{B104} < V_{B103}$.

In this case, the collector current $I_{C101}$ increases by an increment and the collector current $I_{C102}$ decreases by the same increment in the first differential amplifier subcircuit S100. At the same time, the collector current $I_{C103}$ increases by an increment and the collector current $I_{C104}$ decreases by the same increment in the second differential amplifier subcircuit S200. Therefore, the first output current $I_{C113}$ is increased and the second output current $I_{C124}$ is decreased.

Thus, the dc voltage level at the first output terminal 116 is lowered and that at the second output terminal 117 is raised, thereby canceling the dc-voltage level difference (i.e., the dc offset) at the first and second input terminals 114 and 115. This means that no dc offset is generated between the first and second output terminals 116 and 117 even if the dc offset exists between the first and second input terminals 114 and 115.

The dc voltage levels at the first and second output terminals 116 and 117 are determined by a specific dc bias voltage applied to the conventional dc blocking amplifier circuit S300.

The same explanation as above is applied to the case where the dc voltage level at the first input terminal 114 is lower than that at the second input terminal 115.

However, the conventional dc blocking amplifier S300 in FIG. 1 has the following problem.

If any difference is generated between the constant currents $I_{101}$ and $I_{102}$ of the constant current sinks 111 and 112 (i.e., $I_{101} \neq I_{102}$) due to the dc-voltage level difference greater than a specific value at the first and second input terminals 114 and 115, there arises a problem that a dc offset tends to occur between the first and second output terminals 116 and 117. It was found by the inventor that this problem is caused by the fact that the transistors forming one of the constant current sinks 111 and 112 operate in the saturation region while those forming another one of the constant current sinks 111 and 112 operate in the active region, resulting in some difference between the constant currents $I_{102}$ and $I_{102}$.

The dc bias offset thus generated at the first and second output terminals 116 and 117 is amplified by a differential amplifier located at a next stage. Therefore, there arises a disadvantage that the gain of the amplifier at the next stage needs to be set as sufficiently low.

Because of this problem, the conventional dc blocking amplifier S300 in FIG. 1 is not suitable to a dc-offset canceler for the limiting amplifier of the above sort.

Additionally, the difference between the constant currents $I_{101}$ and $I_{102}$ of the constant current sinks 111 and 112 may occur due to any other cause such as the unbalance in device layout of the current sinks 111 and 112.

SUMMARY OF THE INVENTION

Accordingly, an object of the present invention is to provide a dc-offset canceler circuit that cancels a dc offset more effectively.

Another object of the present invention is to provide a dc-offset canceler circuit that suppresses a dc offset due to the current difference of constant current sources/sinks with a simple configuration.

Still another object of the present invention is to provide a dc-offset canceler circuit that is suitable to a limiting amplifier circuit including cascade-connected differential amplifier subcircuits.

A further object of the present invention is to provide a differential amplifier circuit that is preferably used as a limiting amplifier circuit including cascade-connected differential amplifier subcircuits.

The above objects together with others not specifically mentioned will become clear to those skilled in the art from the following description.

According to a first aspect of the present invention, a dc-offset canceler circuit is provided. This circuit is comprised of (a) a first differential pair of first and second bipolar transistors whose emitters are coupled together, (b) a first constant current source/sink supplying/sinking a first constant current to/from the first differential pair, (c) a second differential pair of third and fourth bipolar transistors whose emitters are coupled together, (d) a second constant current source/sink supplying/sinking a second constant current to/from the second differential pair, (e) a fifth bipolar transistor whose emitter is connected to the emitters of the first and second transistors, (f) a sixth bipolar transistor whose emitter is connected to the emitters of the third and fourth transistors, and (g) an ac-coupling element for ac-coupling the first and second differential pairs together.

Bases of the first and fifth transistors are connected to in common a first input terminal. A base of the second transistor is connected to a first end of the coupling element.

Bases of the fourth and sixth transistors are connected in common to a second input terminal. A base of the third transistor is connected to a second end of the coupling element.

Collectors of the first, third, and sixth transistors are connected to a first output terminal. Collectors of the second, fourth, and fifth transistors are connected to a second output terminal.

With the dc-offset canceler circuit according to the first aspect of the present invention, the fifth and sixth bipolar transistors are additionally provided to the first and second differential pairs, respectively.

For example, if the base voltage of the fifth transistor in the first differential pair becomes higher than that of the sixth transistor in the second differential pair due to a dc offset at the first and second input terminals, base voltages of the first and fifth transistors are higher than that of the second transistor, and a base voltage of the third transistor is higher than those of the fourth and sixth transistors. Therefore, collector currents of the first and fifth transistors will increase and that of the second transistor will decrease. At the same time, a collector current of the third transistor will increase and those of the fourth and sixth transistors will decrease.

In this case, the collector current increase of the first, third, and fifth transistors and the collector current decrease of the second, fourth, and sixth transistors serve to cancel the dc offset at the first and second input terminals, because of the collector connection of the first to sixth transistors.

Thus, the dc offset generated at the first and second input terminals is canceled at the first and second output terminals.

Further, for example, if the first constant current of the first constant current source/sink for the first differential pair increases from its specific current value due to a dc offset at the first and second input terminals, the collector currents of the first, second, and fifth transistors will increase according to this current deviation. In this case, the increment of the collector current of the first transistor is supplied to the first output terminal and at the same time, the increments of the collector currents of the second and fifth transistors are supplied to the second output terminal.

As a result, the increments of the collector currents of the first, second, and fifth transistors will be partially canceled with each other. Thus, the resultant current difference between the first and second output terminals will be less than the increase of the first constant current of the first constant current source/sink.

This means that the dc offset due to the current deviation of the first and second constant current sources/sinks is suppressed with a simple configuration. In other words, the canceling of the dc offset current is effectively performed.

Because the dc-offset is effectively canceled, the dc-offset canceler circuit according to the first aspect is suitable to a limiting amplifier circuit including cascade-connected differential amplifier subcircuits.

In a preferred embodiment of the dc-offset canceler circuit according to the first aspect, first and second emitter resistors are further provided. One end of the first emitter resistor is connected to the bases of the first and fifth transistors and the other end thereof is connected to the base of the second transistor. One end of the second emitter resistor is connected to the bases of the fourth and sixth transistors and the other end thereof is connected to the base of the third transistor.

According to a second aspect of the present invention, a differential amplifier circuit is provided. This circuit is comprised of (a) a dc-offset canceler subcircuit having the same configuration as that according to the first aspect of the present invention and (b) a differential amplifier subcircuit for amplifying a differential input signal to differentially generate first and second outputs. The first and second outputs are inputted into the first and second input terminals of the dc-offset canceler subcircuit.

With the differential amplifier circuit according to the second aspect of the present invention, because the dc-offset is effectively canceled by the dc-offset canceler subcircuit, this differential amplifier circuit can be used as a limiting amplifier circuit including cascade-connected differential amplifier subcircuits.

In a preferred embodiment of the differential amplifier circuit according to the second aspect, the dc-offset canceler subcircuit has a gain of 0 dB.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to FIGS. 2 to 4.

FIRST EMBODIMENT

Figure 2:
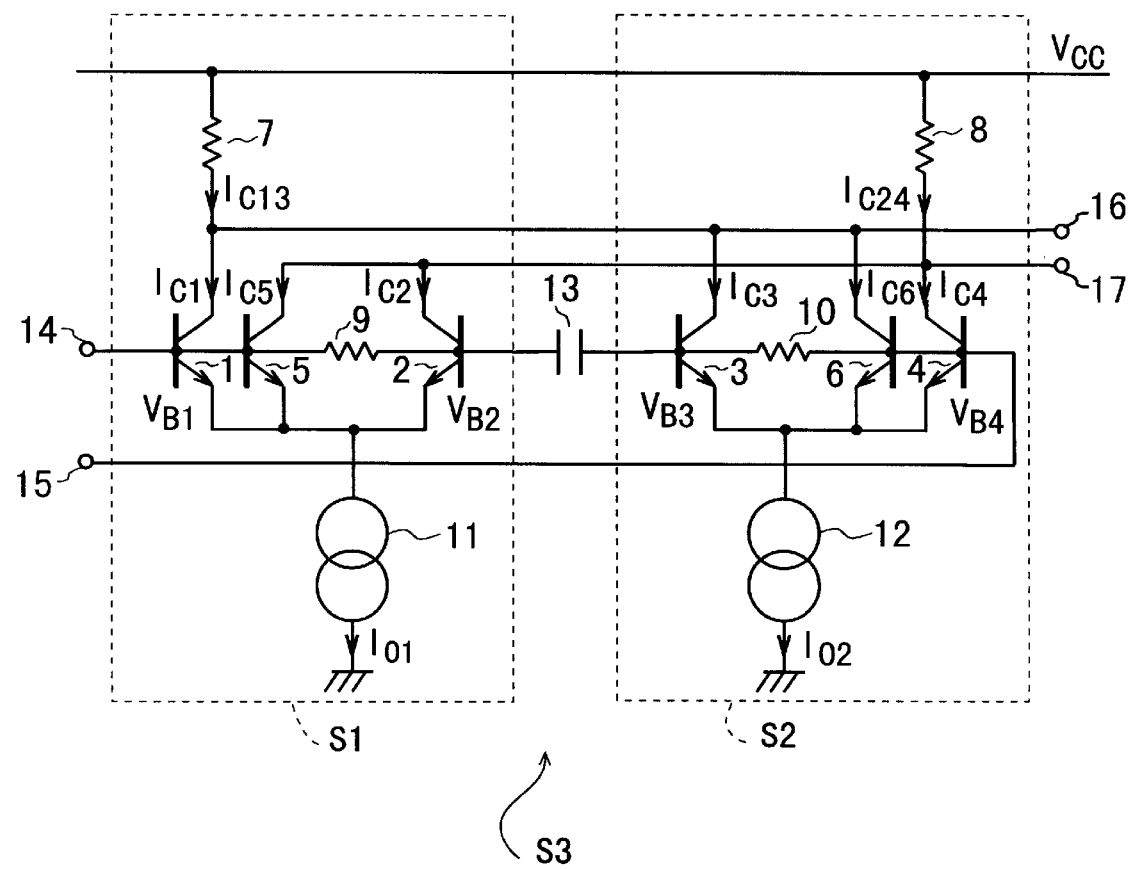
FIG. 2 is a circuit diagram of a dc-offset canceler circuit according to a first embodiment of the present invention.

A dc-offset canceler circuit S3 according to a first embodiment of the present invention has a configuration as shown in FIG. 2.

In FIG. 2, this dc-offset canceler circuit S3 includes a first differential amplifier subcircuit S1 and a second differential amplifier subcircuit S2, which are coupled together by an ac-coupling capacitor 13.

The first differential amplifier. subcircuit S1 is comprised of a first differential pair of npn-type bipolar transistors 1 and 2 whose emitters are coupled together, and a first constant current sink 11 sinking a first constant current $I_{o1}$ from the first differential pair. The coupled emitters of the transistors 1 and 2 are connected to one end of the first constant current sink 11. The other end of the first constant current sink 11 is connected to the ground.

An npn-type bipolar transistor 5 is additionally provided to the first differential pair. An emitter of the transistor 5 is connected to the emitters of the transistors 1 and 2.

Bases of the transistors 1 and 5 are connected to a first input terminal 14. A base of the transistor 2 is connected to the first input terminal 14 through a first resistor 9. The base of the transistor 2 is further connected to one end of the coupling capacitor 13.

The second differential amplifier subcircuit S2 is comprised of a second differential pair of npn-type bipolar transistors 3 and 4 whose emitters are coupled together, and a second constant current sink 12 sinking a second constant current 102 from the second differential pair. The coupled emitters of the transistors 3 and 4 are connected to one end of the second constant current sink 12. The other end of the second constant current sink 12 is connected to the ground.

An npn-type bipolar transistor 6 is additionally provided to the second differential pair. An emitter of the transistor 6 is connected to the emitters of the transistors 3 and 4.

Bases of the transistors 4 and 6 are connected to a second input terminal 15. A base of the transistor 3 is connected to the second input terminal 15 through a second resistor 10. The base of the transistor 3 is further connected to the other end of the coupling capacitor 13.

Collectors of the transistors 1, 3, and 6 are coupled together to be connected to one end of a first load resistor 7. The other end of the first load resistor 7 is applied with a power supply voltage $V_{cc}$. The coupled collectors of the transistors 1, 3, and 6 are further connected to a first output terminal 16.

Collectors of the transistors 2, 4, and 5 are coupled together to be connected to one end of a second load resistor 8. The other end of the second load resistor 8 is applied with the power supply voltage $V_{cc}$. The coupled collectors of the transistors 2, 4, and 5 are further connected to a second output terminal 17.

The transistors 1, 2, and 5 are driven by the constant current sink 11. The transistors 3, 4, and 6 are driven by the constant current sink 12.

The six transistors 1, 2, 3, 4, 5, and 6 have a same emitter area.

Next, the operation of the dc-offset canceler circuit S3 according to the first embodiment in FIG. 2 is explained below.

First, base voltages of the transistors 1, 2, 3, and 4 with respect to the reference point (e,g. the ground) are defined as $V_{B1}$, $V_{B2}$, $V_{B3}$, and $V_{B4}$, respectively. Collector currents of the transistors 1, 2, 3, 4, 5, and 6 are defined as $I_{C1}$, $I_{C2}$, $I_{C3}$, $I_{C4}$, $I_{C5}$, and $I_{C6}$, respectively. First and second output currents flowing through the first and second load resistors 7 and 8 are defined as $I_{C13}$ and $I_{C24}$, respectively.

Then, the following equations (7) and (8) are established.

$$I_{C13} = I_{C1} + I_{C3} + I_{C6} \tag{7}$$

$$I_{C24} = I_{C2} + I_{C4} + I_{C5} \tag{8}$$

The collector currents $I_{C1}$, $I_{C2}$, $I_{C3}$, $I_{C4}$, $I_{C5}$, and $I_{C6}$, of the transistors 1, 2, 3, 4, 5, and 6 are expressed by the following equations (9), (10), (11), and (12).

$$I_{C1} = I_{C5} = \left(\frac{1}{2}\right) \frac{\alpha \cdot I_{01}}{\left[1 + \exp\left\{q\frac{V_{B1} - V_{B2}}{kT}\right\}\right]} \tag{9}$$

$$I_{C2} = \frac{\alpha \cdot I_{01}}{\left[1 + \exp\left\{-q\frac{V_{B1} - V_{B2}}{kT}\right\}\right]} \tag{10}$$

$$I_{C4} = I_{C6} = \left(\frac{1}{2}\right) \frac{\alpha \cdot I_{02}}{\left[1 + \exp\left\{q\frac{V_{B4} - V_{B3}}{kT}\right\}\right]} \tag{11}$$

$$I_{C3} = \frac{\alpha \cdot I_{02}}{\left[1 + \exp\left\{-q\frac{V_{B4} - V_{B3}}{kT}\right\}\right]} \tag{12}$$

Therefore, an. output offset current $\Delta I_1$, which is defined as $\Delta I_1 = (I_{C13} - I_{C24})$, is expressed as the following equation (13), because $I_{C1}$ is canceled by $I_{C5}$ and $I_{C4}$ is canceled by $I_{C6}$.

$$\Delta I_1 = I_{C13} - I_{C24} = I_{C3} - I_{C2} \tag{13}$$

The equation (13) means that the output offset current $\Delta I$ is equal to the difference between the collector currents $I_{C2}$ and $I_{C3}$ of the transistors 2 and 3.

Figure 1:
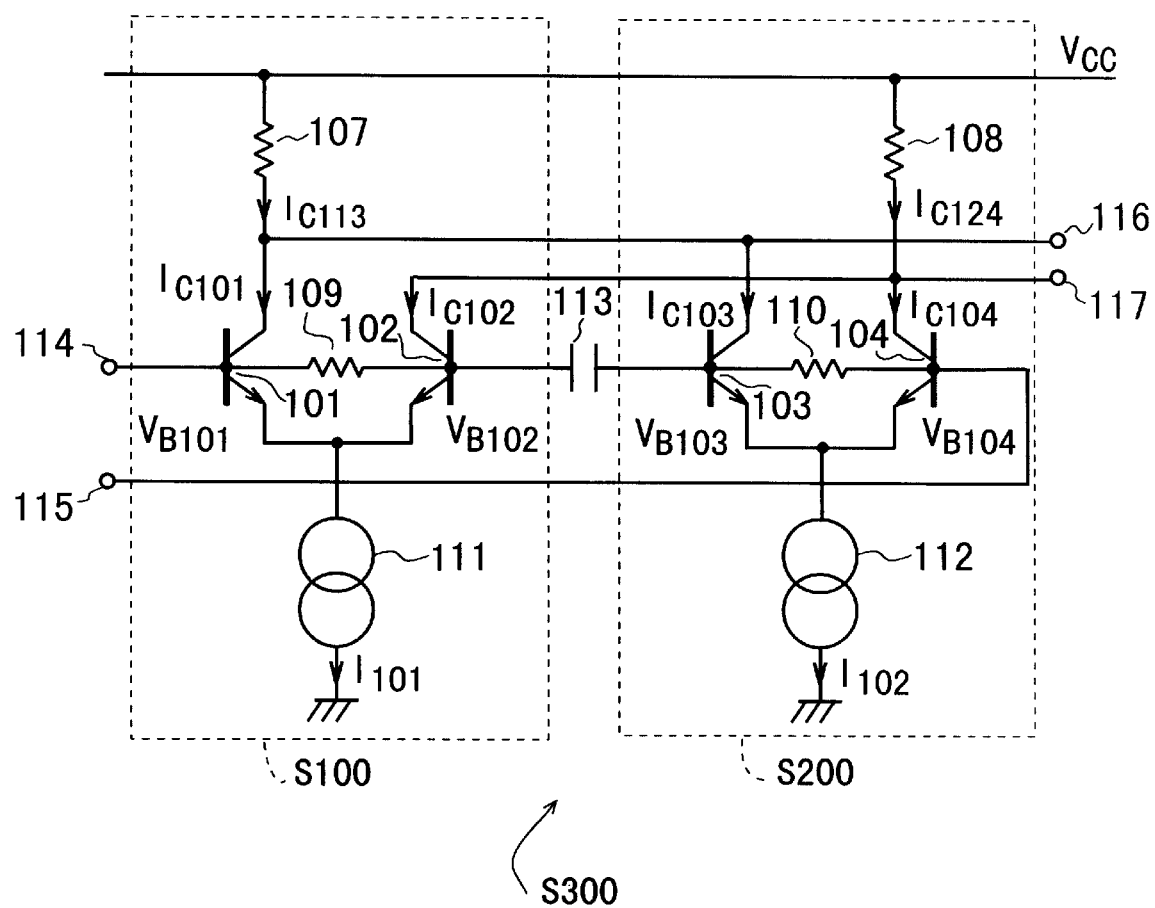
FIG. 1 is a circuit diagram of a conventional dc blocking amplifier circuit with a dc-offset canceling function.

On the other hand, with the conventional dc blocking amplifier circuit S300 in FIG. 1, the output offset current is $\Delta I_2$ is expressed as $\Delta I_2 = (I_{C113} - I_{C124})$, which is greater than $\Delta I_1$. This means that the output offset current of the circuit S3 according to the first embodiment is less than that of the conventional dc blocking amplifier circuit S300.

With the dc-offset canceler circuit S3 according to the first embodiment in FIG. 2, for example, if the base voltage $V_{B1}$ of the transistor 5 in the first differential pair becomes higher than the base voltage $V_{B4}$ of the transistor 6 in the second differential pair due to a dc offset at the first and second input terminals 14 and 15, the base voltages $V_{B1}$ of the transistors 1 and 5 are higher than the base voltage $V_{B2}$ of the transistor 2, and the base voltage $V_{B3}$ of the transistor 3 is higher than the base voltages $V_{B4}$ of the transistors 4 and 6. Therefore, the collector currents $I_{C1}$ and $I_{C5}$ of the transistors 1 and 5 will increase and the collector current $I_{C2}$ of the transistor 2 will decrease. At the same time, the collector current $I_{C3}$ of the transistor 3 will increase and the collector currents $I_{C4}$, $I_{C6}$ of the transistors 4 and 6 will decrease.

In this case, the collector current increase of the transistors 1, 3, and 5 and the collector current decrease of the transistors 2, 4, and 6 serve to cancel the dc offset at the first and second input terminals 14 and 15, because of the collector connection of the transistors 1 to 6.

Thus, the dc offset generated at the first and second input terminals 14 and 15 is canceled at the first and second output terminals 16 and 17.

Further, for example, if the first constant current $I_{01}$ of the first constant current sink 11 for the first differential pair increases from its specific current value due to a dc offset at the first and second input terminals 14 and 15, the collector currents $I_{C1}$, $I_{C2}$, and $I_{C5}$ of the transistors 1, 2, and 5 will increase according to this current deviation. In this case, the increment of the collector current $I_{C1}$ of the transistor 1 is supplied to the first output terminal 16 and at the same time, the increments of the collector currents $I_{C2}$ and $I_{C5}$ of the transistors 2 and 5 are supplied to the second output terminal 17.

As a result, the increments of the collector currents $I_{C1}$, $I_{C2}$, and $I_{C5}$ of the transistors 1, 2, and 5 will be partially canceled with each other. Thus, the resultant current difference (i.e., the output offset current $\Delta I_1$) between the first and second output terminals 16 and 17 will be less than the increase of the first constant current $I_{01}$ of the first constant current sink.

This means that the dc offset due to the current deviation of the first and second constant current sinks 11 and 12 is suppressed with a simple configuration. In other words, the canceling of the dc offset current is effectively performed.

The inventor performed some tests to confirm the advantage of the present invention in the following way.

The resistors 9 and 10 had a same resistance and the voltage drops $(V_{B1}-V_{B2})$ and $(V_{B4}-V_{B3})$ generated by the resistors 9 and 10 were set as 50 mV. The constant currents $I_{01}$ and $I_{02}$ of the constant current sinks 11 and 12 were set as $I_{01}$=9 μA and $I_{02}$=10 μA. In this case, the collector currents $I_{C1}$, $I_{C2}$, $I_{C3}$, $I_{C4}$, $I_{C5}$, and $I_{C6}$ were expressed as $I_{C1}=I_{C5}$=3.926 μA, $I_{C2}$=1.147 μA, $I_{C3}$=1.275 μA, and $I_{C4}=I_{C6}$=4.3625 μA. As a result, the output offset current $\Delta I_1$ was obtained as $\Delta I_1$=0.28 μA.

On the other hand, with the above-explained conventional current blocking circuit S300 in FIG. 1, the collector currents $I_{C1}$, $I_{C2}$, $I_{C3}$, and $I_{C4}$ were expressed as $I_{C1}$=7.852 μA, $I_{C2}$=1.147 μA, $I_{C3}$=1.275 μA, and $I_4$=8.725 μA under the same conditions as above. As a result, the output offset current $\Delta I_2$ was obtained as $\Delta I_2$=0.745 μA.

Accordingly, the output offset current $\Delta I_1$ of the dc-offset canceler circuit 33 according to the first embodiment in FIG. 2 is reduced to approximately 0.38 times as much as the output offset current $\Delta I_2$ of the conventional current blocking circuit S300 in FIG. 1, because (0.28/0.745)≈0.38.

SECOND EMBODIMENT

Figure 3:
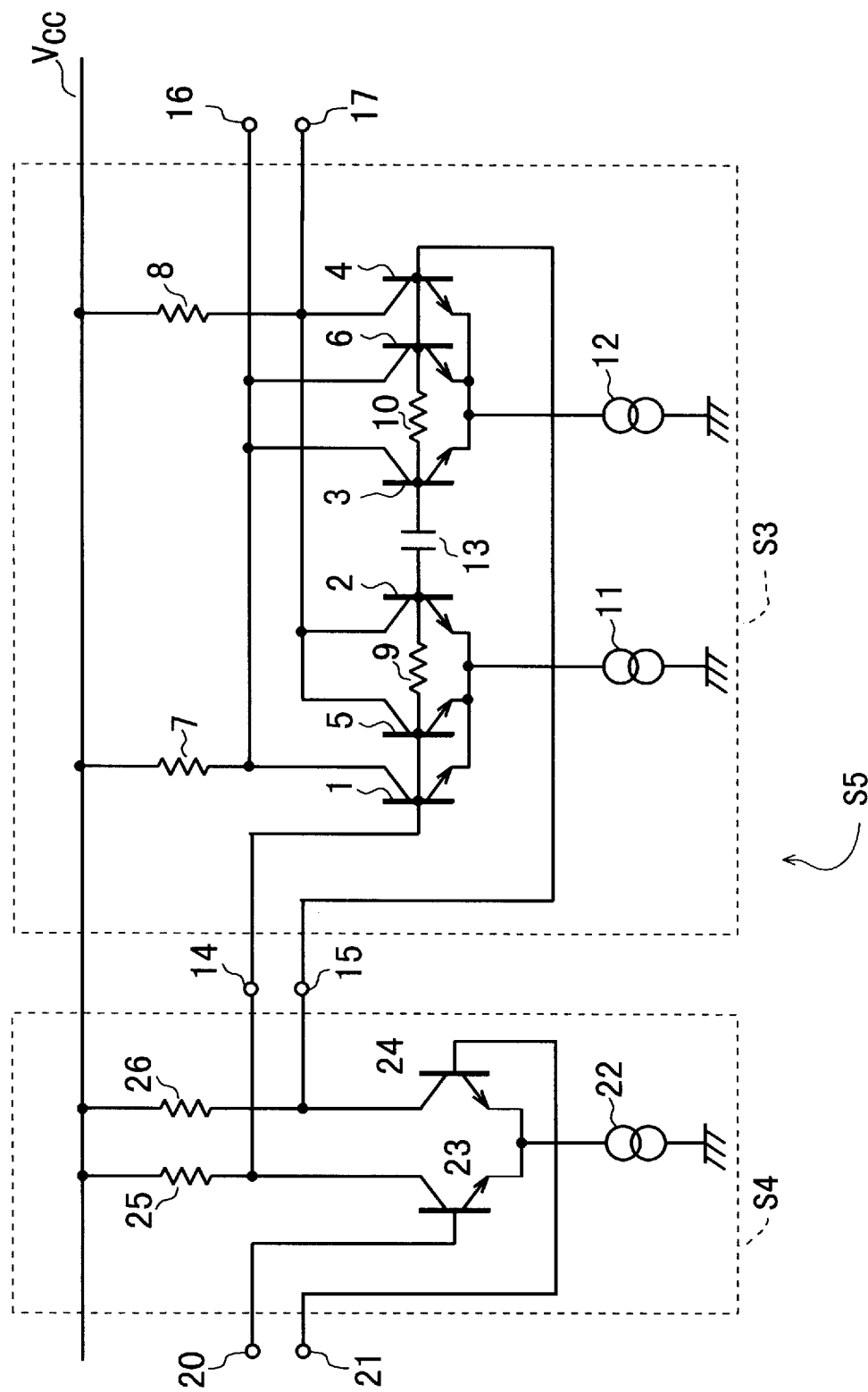
FIG. 3 is a circuit diagram of a single-stage differential amplifier circuit according to a second embodiment of the present invention, which includes the dc-offset canceler circuit according to the first embodiment in FIG. 2.

FIG. 3 shows a single-stage differential amplifier circuit S5 according to a second embodiment of the present invention.

The differential amplifier circuit S5 includes a differential amplifier subcircuit S4 and the dc-offset canceler subcircuit S3 according to the first embodiment in FIG. 2. Therefore, the explanation about the dc-offset canceler subcircuit S3 is omitted here for the sake of simplification.

The differential amplifier circuit S4 includes a differential pair of npn-type bipolar transistors 23 and 24 whose emitters are coupled together. The coupled emitters of the transistors 23 and 24 are connected to one end of a constant current sink 22. The other end of the constant current sink 22 is connected to the ground. The transistors 23 and 24 are driven by the constant current sink 22.

Bases of the transistors 23 and 24 are connected to first and second input terminals 20 and 21, respectively.

Collectors of the transistors 23 and 24 are connected to ends of first and second load resistors 25 and 26, respectively. The other ends of the resistors 25 and 26 are applied with the power supply voltage $V_{cc}$. The collectors of the transistors 23 and 24 are further connected to the first and second input terminals 14 and 15 of the dc-offset canceler subcircuit S3.

The first and second input terminals 20 and 21 serve as input terminals of the single-stage differential amplifier circuit S5 according to the second embodiment, and the first and second output terminals 16 and 17 serve as output terminals thereof.

An initial differential input voltage is applied across the first and second input terminals 20 and 21. First and second differential output voltages of the differential amplifier subcircuit S4 are generated at the collectors of the transistors 23 and 24, respectively. The first and second differential output voltages are applied to the input terminals 14 and 15 of the dc-offset canceler subcircuit S3.

A dc offset generated at the terminals 14 and 15 is effectively canceled by the dc-offset canceler subcircuit S3.

If the dc-offset canceler subcircuit S3 has a gain of 0 dB (i.e., unity gain), this subcircuit S3 serves as a dc blocking circuit. In this case, there is an advantage that only the ac signal in the initial input voltage is selectively transferred to a subsequent circuit (not shown) located at a next stage, because the overall gain of the differential amplifier circuit S5 according to the second embodiment in FIG. 3 is equal to the gain of the differential amplifier subcircuit S4.

THIRD EMBODIMENT

Figure 4:
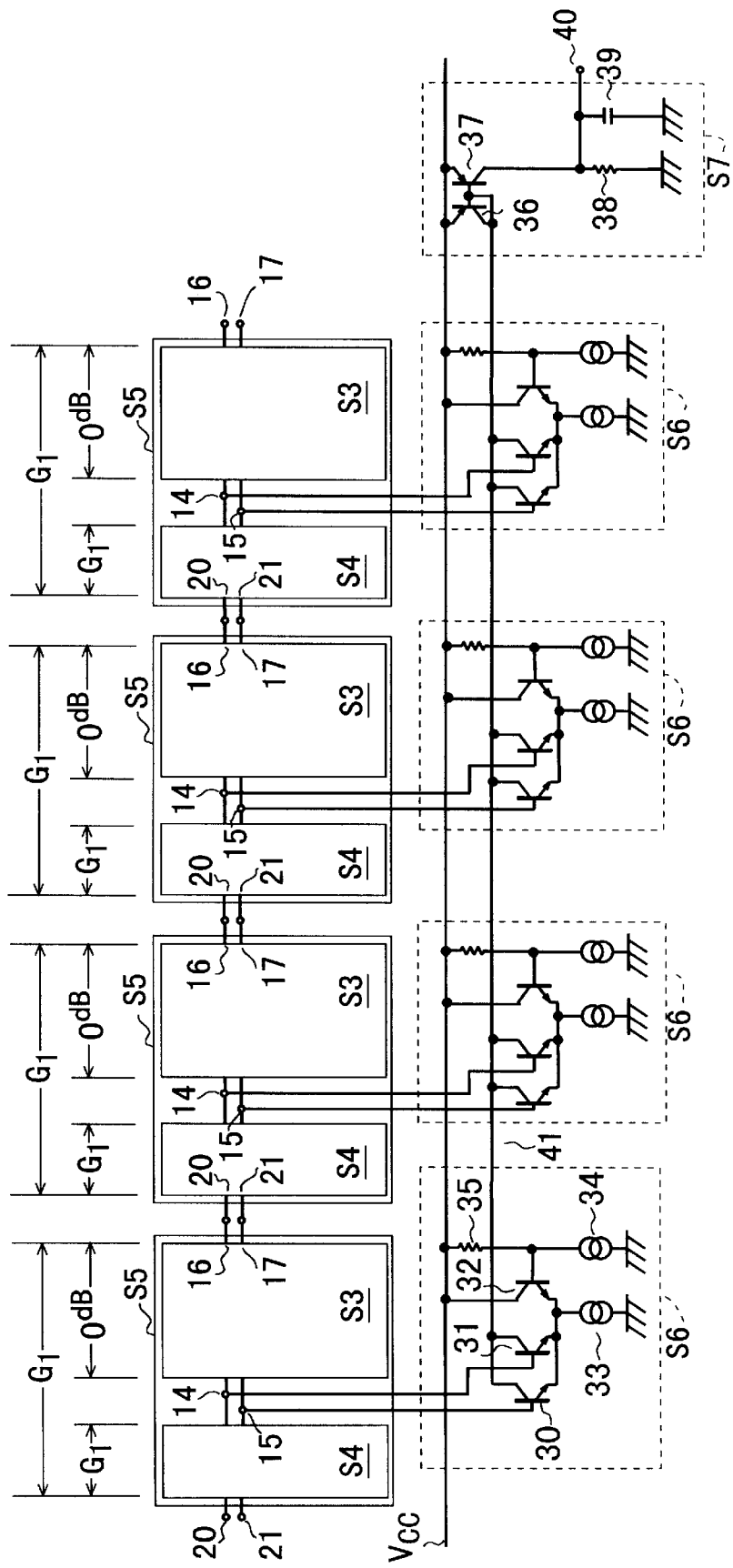
FIG. 4 is a circuit diagram of a four-stage limiting amplifier circuit according to a third embodiment of the present invention, in which a plurality of the single-stage differential amplifier circuits according to the second embodiment in FIG. 2 are cascade-connected.

FIG. 4 shows a four-stage differential amplifier circuit according to a third embodiment of the present invention, in which the four single-stage differential amplifier circuits S5 according to the second embodiment in FIG. 2 are cascade-connected. In other words, the amplifier circuit S5 is used as a basic cell.

The circuit according to the third embodiment serves as a limiting amplifier for a direct conversion receiver of a pager, in which a signal in the baseband frequency region (typically, 1 kHz to 10 kHz) is amplified.

In each basic cell S5, the dc-offset canceler subcircuit S3 has a gain of 0 dB (i.e., unity gain) and serves as a dc blocking circuit. The differential amplifier circuit S5 has a gain of $G_1$ dB, where $G_1$ is greater than unity. Therefore, the gain of the basic cell S5 is equal to G1. Since the basic cells S5 are cascade-connected at the four stages, the overall gain of the limiting amplifier circuit in FIG. 4 is equal to $4G_1$ dB.

The limiting amplifier circuit in FIG. 4 has an advantage that the gain setting and gain adjustment are readily performed, because the overall gain is determined by only the differential amplifier subcircuit S4 in each basic cell.

The reference numeral S6 indicates a full-wave rectifier circuit. The full-wave rectifier circuit S6 is provided for each of the first to fourth stages.

Each of the full-wave rectifier circuits S6 has three npn bipolar transistors 30, 31, and 32, two constant current sinks 33 and 34, and a resistor 35. The differential output signal voltages generated at the first and second output terminals 14 and 15 are inputted into bases of the transistors 30 and 31, respectively The rectified signal currents are outputted from the collectors of the transistors 30 and 31, respectively.

The rectified signal currents outputted from the four differential amplifier circuits S4 are added by a current mirror circuit formed by pnp-type bipolar transistors 36 and 37 in an output circuit S7, resulting in an output signal current. This output signal current is then integrated by an integrator circuit formed by a resistor 38 and a capacitor 39, generating a dc output voltage at an output terminal 40 of the limiting amplifier. The dc output voltage thus generated is used for detecting the electric-field intensity in the received signal by an antenna of the pager. A characteristic about the dc output voltage and the input signal level is obtained.

The full-wave rectifier circuits S6 are provided for the respective differential amplifier circuits S5 in order to increase the detection range of the electric-field intensity.

The power supply voltage Vcc is typically set as low as 1 V, which is readily provided by a battery. In this case, the limiting amplifier circuit according to the third embodiment in FIG. 4 has a suitable characteristic to low-voltage operation.

Specifically, the dc-offset canceler subcircuit S3 according to the first embodiment in FIG. 2 has a transconductance $g_{m1}$ given by the following expression (14)

$$g_{m1} \cong \frac{I_0}{6V_T} \tag{14}$$

where $I_0$ is a current value of the first and second constant current sinks 11 and 12 (i.e., $I_0=I_{01}=I_{02}$) and $V_T$ is the thermal voltage defined as kT/q.

The transconductance $g_{ml}$ in the expression (14) is equal to (⅓) of the transconductance of the differential amplifier circuit S4 in FIG. 3.

When the load resistors 7 and 8 have a same resistance $R_L$ of 30 kΩ, the constant currents $I_{01}$ and $I_{02}$ are set as $I_{01}=I_{02}=5$ μA, and the power supply voltage $V_{CC}$ is set as $V_{CC}=1$ V, the voltage gain $G_v$ is expressed as follows.

$$G_V = g_{m1} \times R_L = \left\{ \frac{5\mu A}{6 \times 25mV} \right\} \times 30 \text{ k}\Omega = 1 (= 0dB)$$

This means that the voltage gain $G_v$ can be set as unity (i.e., 0 dB) if the resistance $R_L$ of the load resistors 7 and 8 is set as 30 kΩ.

On the other hand, the conventional dc blocking amplifier circuit S300 in FIG. 1 has a transconductance $g_{m2}$ given by the following expression (15).

$$g_{m2} \cong \frac{I_0}{4V_T} \tag{15}$$

The transconductance $g_{m2}$ in the expression (15) is equal to (½) of the transconductance of the differential amplifier circuit S4 in FIG. 3, which is greater than that of the dc-offset canceler circuit S3 according to the first embodiment in FIG. 2.

Therefore, to set the gain $G_v$ as unity (i.e., 0 dB) in the conventional circuit S300 in FIG. 1, the load resistance $R_L$ needs to be lower. The lowered resistance $R_L$ raises the dc voltage levels (i.e., dc bias voltage) at the first and second output terminals 116 and 117, because the output voltages at the output terminals 116 and 117 are given by $(I_{C113} \times R_L)$ and ($I_{C124} \times R_L$). This leads to a disadvantage that the obtainable dynamic range of this circuit S300 becomes narrow.

As explained above, the limiting amplifier circuit according to the third embodiment in FIG. 4 is more suitable to the low-voltage operation as low as 1 V than the conventional circuit S300 in FIG. 1.

In the above-explained first embodiment in FIG. 2, the first and second differential pairs are formed by adding the resistors 9 and 10 between the bases of the transistors 2 and 5 and the bases of the transistors 3 and 6, respectively. However, the first and second differential pairs may be formed by making the emitter areas of the transistors different without using the resistors 9 and 10.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A dc-offset canceler circuit comprising:
   (a) a first differential pair of first and second bipolar transistors whose emitters are coupled together;
   (b) a first constant current source/sink supplying/sinking a first constant current to/from said first differential pair;
   (c) a second differential pair of third and fourth bipolar transistors whose emitters are coupled together;
   (d) a second constant current source/sink supplying/sinking a second constant current to/from said second differential pair;
   (e) a fifth bipolar transistor having an emitter connected to said emitters of said first and second transistors;
   (f) a sixth bipolar transistor having an emitter connected to said emitters of said third and fourth transistors; and
   (g) an ac-coupling element for ac-coupling said first and second differential pairs together;
   wherein bases of said first and fifth transistors are connected to a first input terminal, and a base of said second transistor is connected to a first end of said coupling element;
   and wherein bases of said fourth and sixth transistors are connected to a second input terminal, and a base of said third transistor is connected to a second end of said coupling element;
   and wherein collectors of said first, third, and sixth transistors are connected to a first output terminal, and collectors of said second, fourth, and fifth transistors are connected to a second output terminal;
   and wherein a dc offset generated at said first and second input terminals is canceled at said first and second output terminals.

2. A circuit as claimed in claim 1 further comprising first and second emitter resistors;
   wherein one end of said first emitter resistor is connected to said bases of said first and fifth transistors and the other end thereof is connected to said base of said second transistor;
   and wherein one end of said second emitter resistor is connected to said bases of said fourth and sixth transistors and the other end thereof is connected to said base of said third transistor.

3. A circuit as claimed in claim 1, wherein a gain of said dc-offset canceler circuit is designed as 0 dB.

4. A differential amplifier circuit comprising:
   (a) a differential amplifier subcircuit for amplifying a differential input signal to differentially generate first and second outputs; and
   (b) a dc-offset canceler subcircuit for canceling a dc offset generated in said first and second outputs of said differential amplifier subcircuit;
   wherein said dc-offset canceler subcircuit includes;
      (c-1) a first differential pair of first and second bipolar transistors whose emitters are coupled together;
      (c-2) a first constant current source/sink supplying/sinking a first constant current to/from said first differential pair;
      (c-3) a second differential pair of third and fourth bipolar transistors whose emitters are coupled together;
      (c-4) a second constant current source/sink supplying/sinking a second constant current to/from said second differential pair;
      (c-5) a fifth bipolar transistor having an emitter connected to said emitters of said first and second transistors;
      (c-6) a sixth bipolar transistor having an emitter connected to said emitters of said third and fourth transistors; and
      (c-7) an ac-coupling element for ac-coupling said first and second differential pairs together;
      (c-8) bases of said first and fifth transistors being connected to a first input terminal, and a base of said second transistor being connected to a first end of said coupling element;
      (c-9) bases of said fourth and sixth transistors being connected to a second input terminal, and a base of said third transistor being connected to a second end of said coupling element;
      (c-10) collectors of said first, third, and sixth transistors being connected to a first output terminal, and collectors of said second, fourth, and fifth transistors being connected to a second output terminal;
      (c-11) a dc offset generated at said first and second input terminals being canceled at said first and second output terminals.

5. A circuit as claimed in claim 4, wherein said dc-offset canceler subcircuit has a gain of 0 dB.

* * * * *